(12) United States Patent
Dick

(10) Patent No.: US 6,937,871 B2
(45) Date of Patent: Aug. 30, 2005

(54) ANTI-DEMODULATOR CIRCUIT, FILTERING DEVICE AND DEMODULATOR CIRCUIT

(75) Inventor: Burkhard Dick, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 443 days.

(21) Appl. No.: 10/140,500

(22) Filed: May 7, 2002

(65) Prior Publication Data

US 2002/0196878 A1 Dec. 26, 2002

(30) Foreign Application Priority Data

May 10, 2001 (DE) .......................................... 101 22 748

(51) Int. Cl.[7] .......................... H04B 15/00; H04B 7/005; H04B 7/01; H04B 7/015
(52) U.S. Cl. ........................ 455/501; 455/213; 455/214; 455/293; 455/302; 455/306; 455/339; 455/309; 375/323; 375/324; 375/340
(58) Field of Search ................................. 455/501, 302, 455/306, 307, 205, 213, 214, 263, 286, 293, 309, 337, 339, 340, 285; 375/323, 324, 340

(56) References Cited

U.S. PATENT DOCUMENTS

| | | | | |
|---|---|---|---|---|
| 4,866,779 A | * | 9/1989 | Kennedy et al. | ........... 381/94.2 |
| 5,307,517 A | * | 4/1994 | Rich | ........................ 455/306 |
| 5,357,574 A | * | 10/1994 | Whitecar | ........................ 381/4 |
| 5,519,890 A | * | 5/1996 | Pinckley | ........................ 455/307 |
| 5,613,234 A | * | 3/1997 | Vella-Coleiro | ............... 455/340 |
| 6,714,776 B1 | * | 3/2004 | Birleson | ........................ 455/302 |
| 6,807,405 B1 | * | 10/2004 | Jagger et al. | ................ 455/296 |

* cited by examiner

*Primary Examiner*—Nick Corsaro
*Assistant Examiner*—Shaima Q. Aminzay
(74) *Attorney, Agent, or Firm*—Michael J. Uve

(57) ABSTRACT

The invention relates to an anti-demodulator circuit which is fundamentally built up in the same way as a demodulator circuit but, instead of a bandpass filter as generally used in a demodulator, comprises a notch filter which receives an input signal comprising a useful signal and an interference signal, and generates a filtered signal. The notch filter has a center frequency which approximately corresponds to the frequency of the input signal so as to suppress at least a part of the useful signal. The anti-demodulator circuit further comprises a mixer circuit which receives the filtered signal and a phase-shifted input signal and supplies a demodulated output signal which substantially corresponds to the interference signal.

The invention can be particularly used in connection with a filtering device for suppressing interference signals based on adjacent channel disturbances in FM radios, in which the bandwidth of the filtering device is controlled in dependence upon the output signal of the anti-demodulator circuit.

15 Claims, 4 Drawing Sheets

ANTI-DEMODULATOR CIRCUIT, FILTERING DEVICE AND DEMODULATOR CIRCUIT

The invention relates to an anti-demodulator circuit, a filtering device and a demodulator circuit.

An anti-demodulator circuit in the sense of this invention fundamentally operates similarly as a demodulator circuit but suppresses the desired useful signal and improves the S/N ratio. The anti-demodulator circuit may fundamentally be built up in the same way as a known demodulator circuit but, instead of a bandpass filter, it uses a notch filter as a phase shifter or delay member.

The use of notch filters, also in connection with demodulators, for suppressing given frequency ranges is known in the state of the art.

U.S. Pat. No. 5,307,517 describes an adaptive notch filter for suppressing FM interference in FM receiver stations. FIG. 5 of this document shows a circuit arrangement with two PLL demodulators and two prearranged notch filters, which are not used for phase shifting in this arrangement. One branch of the demodulator circuit is used for demodulating a strong signal and the other one is used for demodulating a weak signal. The input signal comprises both useful signals, i.e. the strong and the weak signal, and further, smaller interference signals. The demodulator of the first branch is locked at the stronger signal and adjusts the notch filter of the second branch at the same resonance frequency. The demodulator of the second branch is locked at the weaker signal and adjusts the notch filter of the first branch at the same resonance frequency. Consequently, the weak signal is suppressed and the strong signal is passed in the first branch, and vice versa in the second branch. The notch filters do not form part of the actual demodulator but are prearranged. The notch filters are further not adjusted at the respective useful signals of the branch in which they are provided, but they are adjusted in such a way that they suppress the unwanted signal in the relevant branch, as is conventional practice in the state of the art.

JP 0590040308AA, JP 0060069821AA and JP 0030004630AA describe the use of notch filters in connection with demodulators for improving the S/N ratio.

DE-A-3840999 describes a circuit arrangement for suppressing narrow-band interference signals in a receiver, in which a tuning system in the receiver adjusts a desired frequency band. A computer computes the difference between the frequency at which the receiver is set and the frequency of the largest interference components and controls a PLL oscillator independently thereof. The frequency is adjusted in such a way that the interference components are within the range of a notch filter. The output signal of the notch filter is thus freed from the interference and constitutes an input signal for the demodulator.

Further prior-art demodulators using notch filters for suppressing interference signal frequencies are described in, for example, DE-A-19735798 and DE-A-4220228.

In the conventional FM radio receiver systems, IF filters having an unchangeable filter characteristic, for example, ceramic filters are used which must be realized as external components outside the integrated circuits of the radio receiver and thus are a considerable cost factor. For a given adjacent channel suppression upon reception of a transmitter, a plurality of such filters must be arranged in series. U.S. Pat. Nos. 5,220,686 and 5,341,107 in the name of US Philips Corporation describe radio receivers and particularly high-quality car radios in which at least a part of the selection realized by the IF filters in the IF path is realized in an integrated circuit. Dependent on the signal conditions of the received FM signals, the bandwidth of such integrated filters can be changed. Particularly when there are no or only small interference signals, the bandwidth of the filter should be large while it should be correspondingly reduced when interference signals occur. In a demodulator circuit described in U.S. Pat. No. 5,341,107, the integrated filters can be controlled independently of interference components via an adjacent channel detector (ACD) whose input signal is the output signal of the FM demodulator (MPX signal). The FM demodulator is set at the IF input signal and optimized for the IF useful signal. When one or more interference signals occur, this FM demodulator thus supplies the adjacent channel detector with a signal having a relatively high signal to noise ratio and thus with a relatively poor disturbance to signal ratio. To optimally control the integrated IF filters in dependence upon the interference components, the demodulated signal should therefore be freed from the useful signal component by way of elaborate filtering in the adjacent channel detector so as to improve the disturbance to signal ratio. This requires a considerably large number of components.

FIGS. 1 and 2 show the fundamental structure of the prior-art FM demodulators. The demodulators comprise a first-order bandpass filter 10 as a phase shifter, whose phase is 0° for the frequency of the IF useful signal (f=f0). To normalize the demodulated signal OMPX for the intermediate frequency IF (f=f0), a constant 90° phase shifter may be inserted in a branch (FIG. 1) or the demodulator can be controlled with 0° (INCOS) and −90° (INSIN) signals (FIG. 2).

FIG. 3 shows a circuit of a sophisticated demodulator as described in U.S. Pat. No. 5,341,107 which is herein incorporated by reference. Also in this embodiment of a demodulator, the phase shifter is realized as a first-order bandpass filter or resonance amplifier 10 whose resonance frequency can be linearly controlled. The bandpass filter is controlled with 0° (INCOS) and −90° (INSIN) input signals. The circuit has a cosine path and a sine path in which the transfer function for both paths is identical and the phase difference between the two paths is 90° for all frequencies. The phase variation of each path essentially corresponds to that of a first-order bandpass filter. The demodulator shown in FIG. 3 constitutes a closed loop via a resonance frequency control input 12 of the bandpass filter 10. The center frequency f0 of the bandpass filter 10 is always adjusted at the instantaneous frequency of the FM input signals due to the feedback of the output signal OMPX which corresponds to the demodulated input signal. At this frequency, the phase shift in a path is zero. Thus, the input signals of the mixers 14, 16 of the two paths are phase-shifted by 90°, and in the stable state the output signals are thereby quasi-zero. Based on the linear dependence between the resonance frequency of the resonance amplifier 10 and the control signal for adjusting the resonance amplifier 10, the demodulated output signal OMPX can be directly used as a control signal in the closed loop.

The demodulated output signal OMPX is constituted in the demodulator circuit shown in FIG. 3 by addition or subtraction of the output signals of the cosine path and the sine path, wherein an adder circuit 18 provided for this purpose precedes a loop filter 20 and an amplifier circuit 22.

When an unmodulated useful signal with an intermediate frequency f=f0 and an unmodulated interference component with a frequency f=f1 are applied to the demodulator circuit of FIGS. 1, 2 or 3, the frequency of the output signal corresponds to the value of f0–f1. In conventional radio receiver applications, a frequency of 100 kHz or 200 kHz above or below the frequency of the useful signal may be assumed for an interference component of an adjacent channel. The frequency of the output signal OMPX is then equal to the difference frequency of 100 kHz and 200 kHz, respectively. The amplitude of the output signal is dependent on the amplitude distance of the input signals and on the frequency distance. The frequency dependence is obtained from the Q factor of the bandpass filters 10 which in turn determines the bandwidth of the demodulator in FIGS. 1 and 2. The demodulator bandwidth should at least be as large as the maximum frequency distance. In FIG. 3, the bandwidth of the demodulator may be adjusted via the limit frequency of the loop filter 20. In practice, a DC signal or DC offset is obtained only at a small amplitude distance between the interference signal and the useful signal.

In FIG. 3, the demodulator bandwidth is influenced by the Q factor of the bandpass filter 10, but is mainly determined by the limit frequency of the loop filter 20.

When the demodulator circuits shown in FIGS. 1 to 3 are used for adjacent channel detection so as to adjust, for example, a filtering device in a radio receiver for a given adjacent channel suppression in dependence upon the interference components, these circuit arrangements have the drawback that the demodulated signal OMPX has a poor S/N ratio (which is desired in itself) because the bandpass filter 10 attenuates the interference components in proportion with the useful signal. To also detect the interference signal, the demodulator requires a much higher bandwidth than usual. This in turn leads to a reduction of the efficiency for the demodulation of the useful signal. For example, the higher harmonic oscillation components of the frequency f0 will increase at the output of the demodulator circuit shown in FIG. 3, which oscillations are produced in the mixer circuits 14, 16. The Q factor of the bandpass filter 10 can no longer be optimally adjusted to the useful signal in the case of an increased bandwidth. Measurements have further shown that a reduction of the bandwidth of the bandpass filter 10 clearly improves the behavior with respect to interference signals which may be produced when two or more signals occur at the antenna input in the further signal path.

When a modulated useful signal and a modulated interference signal are supplied to a demodulator circuit as shown in FIG. 1, 2 or 3, the (desired) useful signal components comprised in the demodulated signal OMPX are very large and must be filtered in a considerably elaborate effort to be able to use this signal for the adjacent channel suppression. The otherwise relatively weak signal which is generated by the interference component at f0–f1, must be prepared with a correspondingly high number of components so as to adjust the filtering device for the adjacent channel suppression. The frequency dependence of the difference frequency between the useful signal and the interference signal further deteriorates the function for controlling the IF filtering device.

As stated hereinbefore, a DC offset is adjusted only at a small amplitude distance between the interference signal and the useful signal, which offset occurs abruptly at a given point. This point may be detected by an offset detector, further processed and additively used for controlling the filtering device. When the DC offset is, however, small, the offset detector must have a high amplification and thus requires a correspondingly high number of components, while additionally a relatively elaborate adjustment with respect to the DC offset is required in practice, which offsets have a different origin, i.e. DC offsets which occur at the demodulator output and are not caused by the interference components. The abrupt occurrence of the DC offset at a given, small amplitude distance further necessitates a very rapidly reacting system which, in practice, is sensitive to spreads in the integrated components as regards stability and freedom from interference.

It is therefore an object of the invention to provide a demodulator circuit for high-quality FM radio receivers which allows an effective and simple adjacent channel suppression and requires a minimal number of circuit components.

This object is solved by an anti-demodulator circuit as defined in claim 1, a filtering device as defined in claim 9 and a demodulator circuit as defined in claim 12.

Fundamentally, the anti-demodulator circuit according to the invention is built up in the same way as a demodulator circuit but, instead of the bandpass filter, has a notch filter which receives an input signal comprising a useful signal and an interference signal, and generates a filtered signal, the notch filter having a center frequency which approximately corresponds to the frequency of the input signal in order to at least suppress a part of the useful signal. The anti-demodulator circuit further comprises a mixer circuit which receives the filtered signal and a phase-shifted input signal and supplies a demodulated output signal which substantially corresponds to the interference signal.

The fundamental concept of this invention is thus based on an anti-demodulator circuit comprising a notch filter instead of the bandpass filter conventionally used in the prior-art demodulators and suppresses the desired signal (useful signal) and improves the S/N ratio.

In a preferred embodiment, a phase-shifting network is arranged in series with the notch filter so as to obtain a DC offset with a high S/N ratio.

In a particularly simple embodiment, the notch filter may be realized by subtracting the output signal of a bandpass filter from its input signal. This is particularly favorable when a conventional demodulator and an anti-demodulator according to the invention are used in combination so as to obtain a demodulated interference signal for the adjacent channel suppression as well as a demodulated useful signal for the radio receiver, while the bandpass filter can be jointly used in both demodulators so that redundant components are avoided.

In a further preferred embodiment of the invention, the notch filter precedes a pulse-forming stage so as to suppress higher harmonic oscillations up to a certain extent.

Further preferred embodiments of the invention are defined in the dependent claims.

The invention also relates to a filtering device for suppressing interference signals and particularly adjacent channel disturbances, comprising an anti-demodulator circuit of the type described above, in which the bandwidth of the filtering device is controlled in dependence upon the output signal of the anti-demodulator circuit.

Finally, the invention also relates to a demodulator circuit comprising a bandpass filter circuit and an anti-demodulator circuit of the type described above, in combination and particularly in a parallel arrangement.

The anti-demodulator circuit according to the invention may be used, for example, in the integrated circuit for FM radio receivers which have a completely integrated IF filtering device with an adjustable bandwidth. The bandwidth may be continuously adjusted in dependence upon the extent of interference in the signal field, starting from a broad band when there is no interference, up to a very narrow band for large interference. The control signal for controlling the bandwidth is parallel detected via an adjacent channel detector (ACD) and an offset detector by the output of the anti-demodulator according to the invention. Since the anti-demodulator can be optimized to the interference signal, the disturbance to signal ratio will be high.

The anti-demodulator circuit according to the invention renders a large part of the number of components for the circuit superfluous and thus saves valuable chip space for filtering and amplification of the output signal of the demodulator for the adjacent channel suppression, because the interference signal can already be detected in an optimum way with the anti-demodulator. The system is less sensitive to spreads of internal components and its stability and reliability are clearly improved as compared with the prior art.

These and other aspects of the invention are apparent from and will be elucidated with reference to the embodiments described hereinafter.

In the drawings:

FIGS. 1 to 3 are circuit diagrams of demodulator circuits, using bandpass filters in accordance with the prior art, in which FIG. 3 is based on a prior patent application in the name of the applicant.

Figure 1:
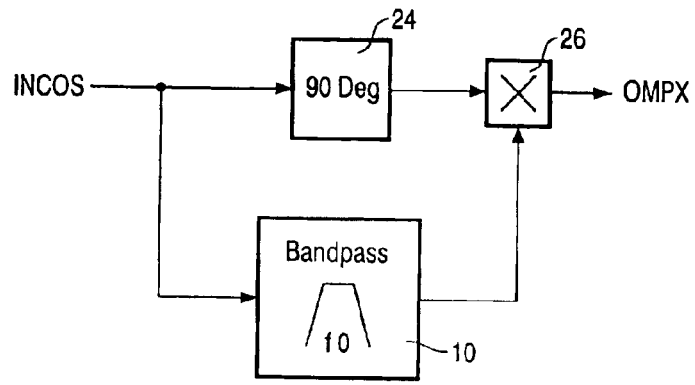
FIG. 1 is a circuit diagram of a fundamental principle of a demodulator in accordance with the prior art.

FIG. 1 shows a first-order bandpass filter circuit 10, a 90° phase-shifting circuit 24 and a mixer circuit 26. Corresponding components are denoted by the same reference numerals in FIG. 2.

Figure 2:
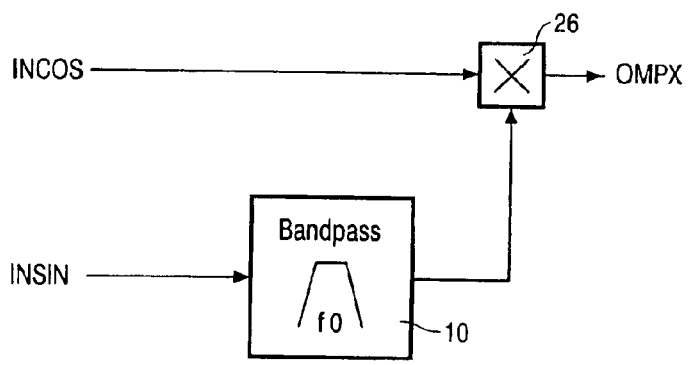
FIG. 2 is a circuit diagram of the fundamental principle of a modified demodulator in accordance with the prior art.

The functions of the circuits of FIGS. 1 and 2 correspond and have already been described hereinbefore with reference to the prior art.

Figure 3:
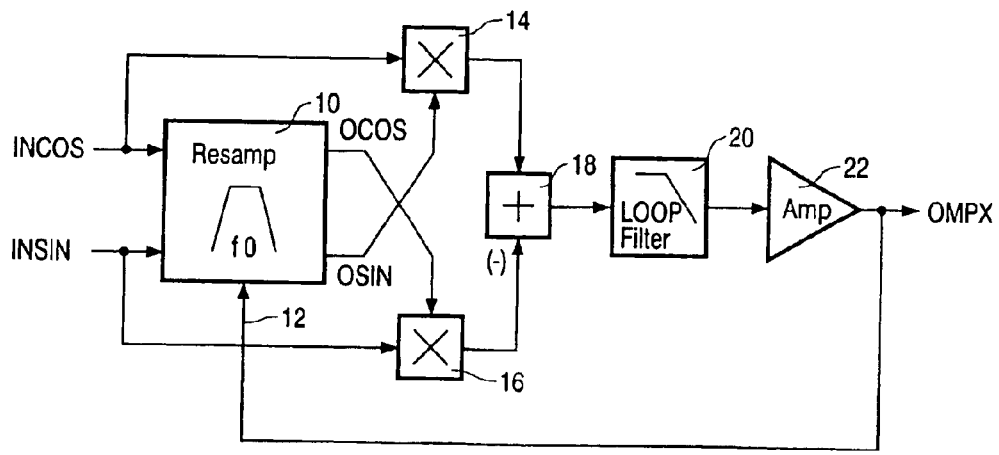
FIG. 3 is a circuit diagram of a demodulator described in a prior patent application in the name of the applicant.

The circuit of FIG. 3 corresponds to that described in U.S. Pat. No. 5,341,107, which is herein incorporated by reference. It has also been described hereinbefore with reference to the prior art.

Figure 4:
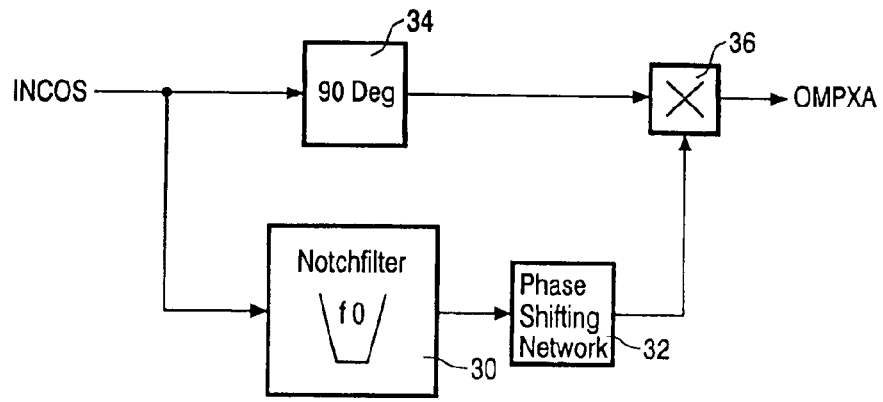
FIG. 4 is a circuit diagram of the fundamental principle of the anti-demodulator according to the invention.
Figure 5:
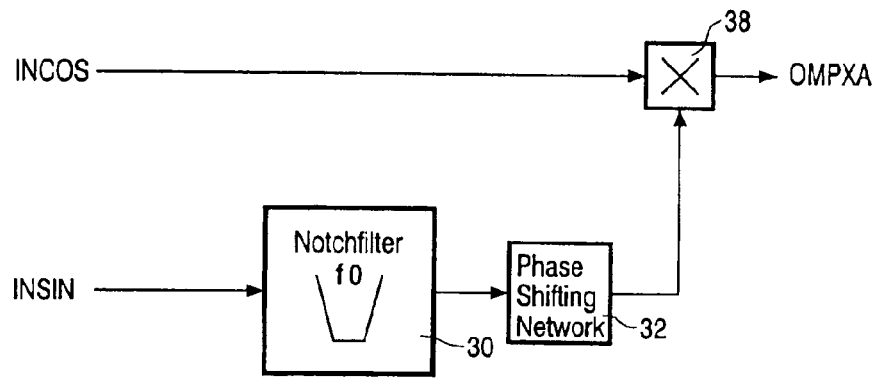
FIG. 5 is a circuit diagram of the fundamental principle of a modification of the anti-demodulator according to the invention.
Figure 6:
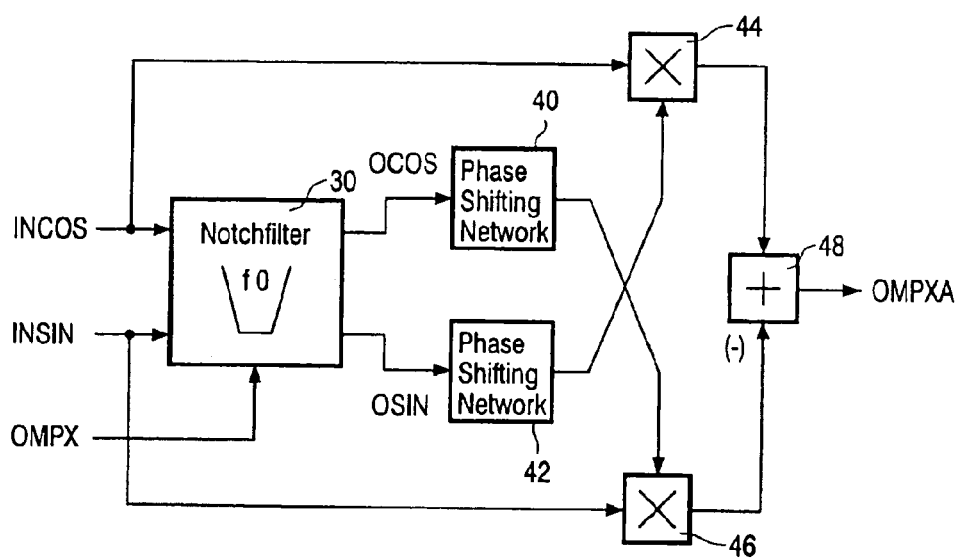
FIG. 6 is a diagram of a preferred embodiment of the anti-demodulator according to the invention.

FIGS. 4 to 6 show a first, a second and a third embodiment of the anti-demodulator according to the invention, in which the circuits correspond to the demodulator circuits of FIGS. 1 to 3 but the bandpass filter circuit 10 is replaced by a notch filter circuit, or notch filter, 30.

The anti-demodulator circuit of FIG. 4 does not only comprise the notch filter circuit 30 but also a phase-shifting network 32, a fixed 90° phase shifter 34 and a mixer circuit 36 which are connected together in the way shown in FIG. 4. The anti-demodulator circuit of FIG. 4 receives a 0° signal as an input signal with an interference signal component and a useful signal component and generates a demodulated interference signal OMPXA with a high S/N ratio at its output, because the notch filter 30 can suppress a large part of the useful signal.

The alternative circuit structure shown in FIG. 5 comprises the notch filter circuit 30, a phase-shifting network 32 and a mixer circuit 38 which are connected together in the way shown in FIG. 5.

The anti-demodulator circuit of FIG. 5 fundamentally operates similarly as the circuit of FIG. 4, in which the anti-demodulator circuit receives a 0° signal and a 90° signal as input signals so that the 90° phase shifter of the circuit of FIG. 4 can be omitted. The 0° signal and the 90° signal may of course also be exchanged.

The phase-shifting network 32 preceded by the notch filter circuit 30 can influence the DC offset at the output (OMPXA) of the anti-demodulator circuit for f=f0 (i.e. for the case where only a useful signal but no interference signal is present). Simulations have proved that, upon occurrence of an interference signal, the DC offset is also drastically increased already at large amplitude distances between the interference signal and the useful signal (i.e. interference components<<useful signal) when using such a phase-shifting network. In this case, the DC offset no longer occurs abruptly but continuously so that the system overall becomes less sensitive to spreads. Moreover, the amplitude of the resultant alternating signal becomes clearly larger at the frequency f0–f1 and independent of f0–f1 . (As explained above, the frequency of the output signal is dependent on the value of f0–f1 in a prior-art demodulator, where f0 is the frequency of the unmodulated useful signal and f1 is the frequency of the unmodulated interference component.) Consequently, the number of circuit components in the adjacent channel detector using the output signal OMPXA of the anti-demodulator as a control signal, and the number of circuit components in the offset detector can be considerably reduced while simpler filters and a smaller amplification may be used particularly in the adjacent channel detector, while a smaller amplification and no offset adjustment are necessary in the offset detector.

FIG. 6 shows a further embodiment of the anti-demodulator according to the invention, comprising a notch filter circuit 30, two phase-shifting networks 40, 42, two mixer circuits 44, 46 and an adder stage 48 which are connected together in the way shown in FIG. 6. Similarly as the demodulator of FIG. 3, the anti-demodulator of FIG. 6 comprises a cosine branch and a sine branch in which the useful signal can be substantially completely suppressed in the embodiment of FIG. 6 because the center frequency of the notch filter circuit 30 can always be adjusted at the instantaneous frequency of the input signal via a control input 50 and with the aid of the demodulated useful signal OMPX.

The anti-demodulator of FIG. 6 operates similarly as the demodulator circuit of FIG. 3, in which the output signal OMPXA corresponds to the demodulated interference signal which substantially does not comprise any component of the useful signal. When such an anti-demodulator circuit is used in an FM radio receiver for adjacent channel detection, the bandwidth of the demodulator of the radio receiver can be optimally tuned to the useful signal.

Figure 7:
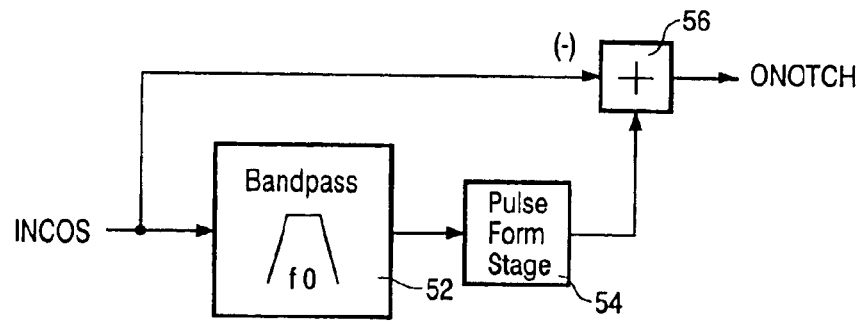
FIG. 7 is a circuit diagram of a preferred embodiment of the notch filter used in the anti-demodulator according to the invention.

FIG. 7 shows a circuit for realizing the notch filter circuit of the anti-demodulator according to the invention by means of a bandpass filter, which has the particular advantage that the notch filter can be realized while using the demodulator bandpass filter which is regularly present in, for example, an FM radio receiver. The number of circuit components for the anti-demodulator according to the invention is thereby reduced considerably. Assuming that the demodulator comprises a first-order bandpass filter, the notch filter circuit can be realized in accordance with formula 1−A(BP)=A(NOTCH), wherein A(BP) is the transfer function of the bandpass filter and A(NOTCH) is the transfer function of the notch filter in accordance with the following formulas.

$$A(BP) = \frac{a \cdot jw}{1 + a \cdot jw + b \cdot (jw)^2}, \quad W_0 = \frac{1}{\sqrt{b}}$$

$$A(NOTCH) = \frac{1 + b \cdot (jw)^2}{1 + a \cdot jw + b \cdot (jw)^2}, \quad W_0 = \frac{1}{\sqrt{b}}$$

The notch filter circuit of FIG. 7 using the demodulator bandpass filter comprises a bandpass filter 52, a pulse-forming stage 54 and an adder stage 56 which are connected together in the way shown in FIG. 7. The input signal of the notch filter is a 0° input signal INCOS and the output signal is denoted as notch filter output signal ONOTCH.

The input signal INCOS or INSIN of the notch filter circuit is often a square-wave signal, particularly an output signal of a prearranged limiter. The suppression of the useful signal, for example, with respect to higher harmonic oscillations, can be optimized by a pulse-forming stage 54 arranged in series with the bandpass filter 52. In the simplest case, the pulse-forming stage 54 is realized as a non-negatively fed-back differential amplifier.

Figure 8:
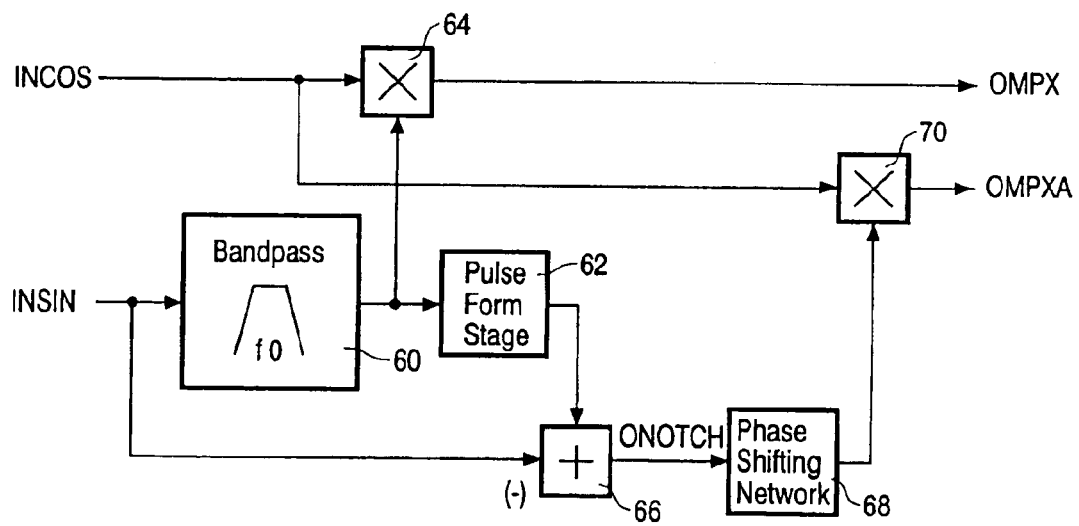
FIG. 8 is a circuit diagram of the fundamental principle of the anti-demodulator according to the invention, in combination with a prior-art demodulator.
Figure 9:
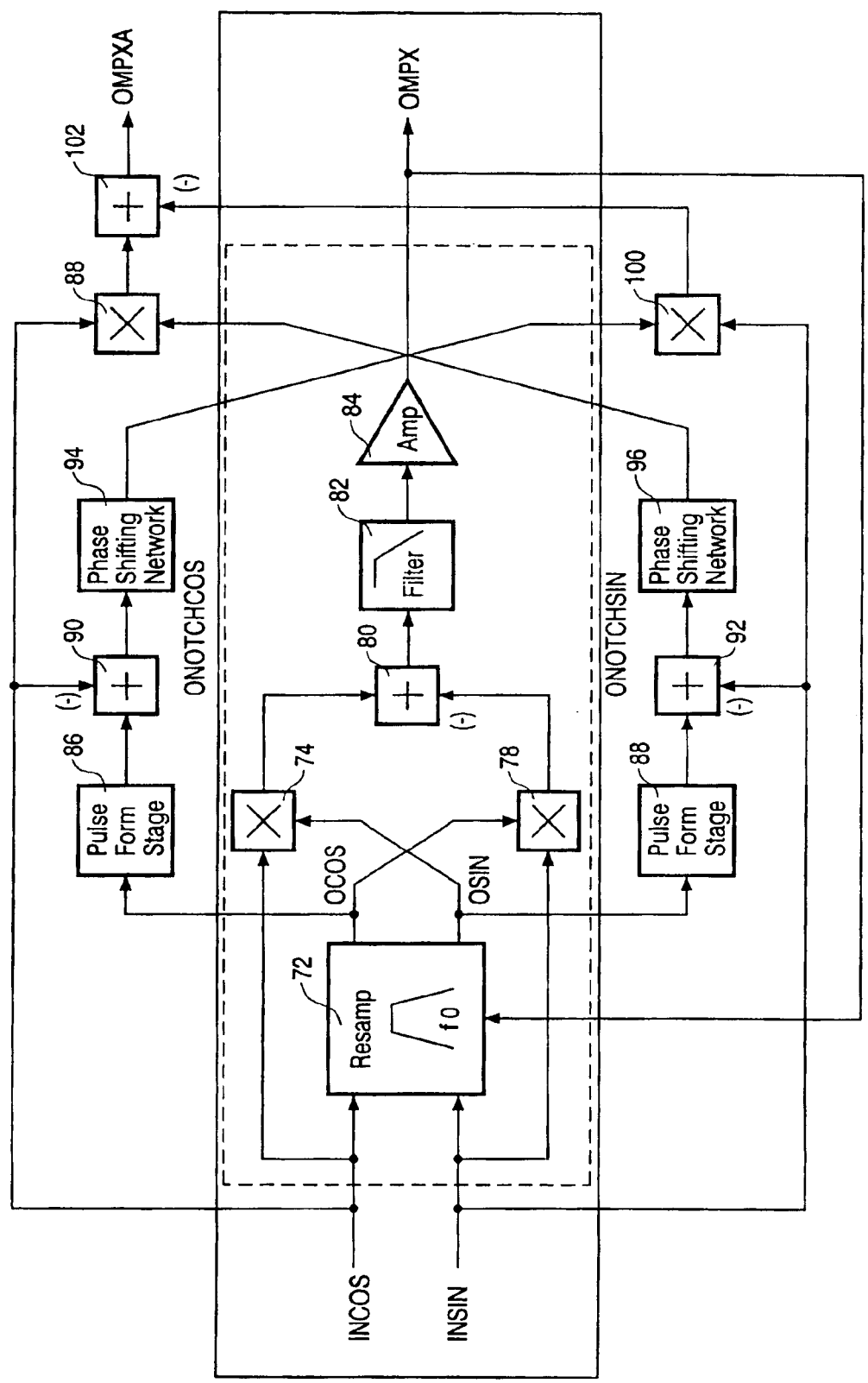
FIG. 9 is a circuit diagram of a preferred embodiment of the anti-demodulator according to the invention, in combination with the demodulator circuit of FIG. 3.

FIGS. 8 and 9 show two preferred embodiments of the anti-demodulator according to the invention, in combination with a conventional demodulator, realized with a minimal number of circuit components. The embodiment shown in FIG. 8 corresponds to that in FIG. 2 and the embodiment shown in FIG. 9 corresponds to that in FIG. 3, while the demodulator part is denoted by a broken-line rectangle in FIG. 9.

The anti-demodulator/demodulator circuit shown in FIG. 8 comprises a bandpass filter circuit 60, a pulse-forming stage 62, a mixer circuit 64, an adder stage 66, a phase-shifting network 68 and a further mixer circuit 70 which are connected in the way shown in FIG. 8. The anti-demodulator/demodulator circuit combines the demodulator function of FIG. 2 and the anti-demodulator function of FIG. 5, while the notch filter circuit 30 of FIG. 5 is replaced by the circuit shown in FIG. 7.

FIG. 9 shows a preferred embodiment of an anti-demodulator/demodulator circuit according to the invention. It comprises a bandpass filter circuit 72, two mixer circuits 74 and 78, an adder stage 80, a loop filter circuit 82, an amplifier stage 84, two pulse-forming stages 86, 88, two further adder stages 90, 92, two phase-shifting networks 94, 96, two further mixer circuits 98, 100 and one further adder stage 102 which are connected together in the way shown in FIG. 9. The anti-demodulator/demodulator circuit of FIG. 9 comprises a demodulator which corresponds to the embodiment shown in FIG. 3 and is denoted by the broken line box. It further comprises an anti-demodulator with a cosine branch and a sine branch which corresponds to the embodiment shown in FIG. 6, while the notch filter circuit 30 of FIG. 6 is replaced by the circuit of FIG. 7. The advantage of the anti-demodulator/demodulator circuit shown in FIG. 9 as compared with the variants described hereinbefore is again that the center frequency of the notch filter circuit of the anti-demodulator and hence of the bandpass filter circuit 72 of the demodulator follows the instantaneous frequency of the input signals.

The characteristic features disclosed in the foregoing description, claims and drawings may be significant for the invention in its various embodiments, both individually and also in an arbitrary combination.

LIST OF REFERENCE SIGNS

| | |
|---|---|
| bandpass filter | 10 |
| resonance frequency control input | 12 |
| mixer | 14, 16 |
| adder circuit | 18 |
| loop filter | 20 |
| amplifier circuit | 22 |
| phase-shifting circuit | 24 |
| mixer circuit | 26 |
| notch filter circuit | 30 |
| phase-shifting network | 32, 34 |
| mixer circuit | 36, 38 |
| phase-shifting network | 40, 42 |
| mixer circuit | 44, 46 |
| adder stage | 48 |
| control input | 50 |
| bandpass filter | 52 |
| pulse-forming stage | 54 |
| adder stage | 56 |
| bandpass filter circuit | 60 |
| pulse-forming stage | 62 |
| mixer circuit | 64 |
| adder stage | 66 |
| phase-shifting network | 68 |
| mixer circuit | 70 |
| bandpass filter circuit | 72 |
| mixer circuit | 74, 78 |
| adder stage | 80 |
| loop filter circuit | 82 |
| amplifier stage | 84 |
| pulse-forming stage | 86, 88 |
| adder stage | 90, 92 |
| phase-shifting network | 94, 96 |
| mixer circuit | 98, 100 |
| adder stage | 102 |

What is claimed is:

1. An anti-demodulator circuit comprising a notch filter (30) which receives an input signal (INCOS) comprising a useful signal and an interference signal, and generates a filtered signal, wherein the notch filter (30) has a center frequency which approximately corresponds to the frequency of the input signal for suppressing at least a part of the useful signal, and a mixer circuit (36; 38) which receives the filtered signal and a phase-shifted input signal (INSIN) and supplies a demodulated output signal (OMPXA) which substantially corresponds to the interference signal.

2. An anti-demodulator circuit as claimed in claim 1, characterized in that a phase-shifting network (32) is arranged in series with the notch filter (30).

3. An anti-demodulator circuit as claimed in claim 1, characterized by a 90° phase shifter preceding the mixer circuit (36; 38) for generating a 90° phase-shifted input signal (INSIN) for the mixer circuit (36; 38).

4. An anti-demodulator circuit as claimed in claim 1, characterized in that the notch filter (30) receives the input signal (INCOS) and a 90° phase-shifted input signal (INSIN), and generates two 90° phase-shifted notch filter output signals (OCOS, OSIN), the notch filter (30) precedes a phase-shifting network (40, 42) which receives the notch filter output signals (OCOS, OSIN) and is constituted by two demodulator branches each comprising a mixer circuit (44, 46), a first input of a first mixer circuit (44) receiving the input signal and a second input of the first mixer circuit (44) receiving an output signal of the phase-shifting network which is based on the 90° phase-shifted input signal, a first input of the second mixer circuit (46) receiving the 90° phase-shifted input signal and a second input of the second mixer circuit (46) receiving an output signal of the phase-shifting network which is based on the non-phase-shifted input signal, and the output signals of the mixer circuits (44, 46) being combined in an adder circuit (48) so as to generate a demodulated interference signal (OMPXA).

5. An anti-demodulator circuit as claimed in claim 4, characterized in that the center frequency of the notch filter (30) is controllable in dependence upon the useful signal.

6. An anti-demodulator circuit as claimed in claim 1, characterized in that the notch filter is realized by means of a bandpass filter (52) in accordance with the formula "1−A(BP)=A(Notch)", wherein A(BP) is the transfer function of the bandpass filter (52) and A(Notch) is the transfer function of the notch filter.

7. An anti-demodulator circuit as claimed in claim 6, characterized in that the notch filter comprises a bandpass filter circuit (52; 60) and an adder circuit (56; 66), the bandpass filter circuit (52; 60) receives the input signal and generates a bandpass-filtered input signal, and the adder circuit (56; 66) generates a notch filter output signal (ONOTCH) as a difference between the bandpass-filtered input signal and the input signal.

8. An anti-demodulator circuit as claimed in claim 1, characterized in that a pulse-forming stage (54; 62) is arranged in series with the notch filter.

9. A filtering device for suppressing interference signals, characterized by an anti-demodulator circuit as claimed in claim 1, in which the bandwidth of the filtering device can be controlled in dependence upon the output signal (OMPXA) of the anti-demodulator circuit.

10. A demodulator circuit comprising a bandpass filter circuit and an anti-demodulator circuit as claimed in claim 1, arranged parallel to the bandpass filter circuit.

11. A demodulator circuit as claimed in claim 10, characterized in that the center frequency of the bandpass filter circuit can be controlled in dependence upon the demodulated useful signal (OMPX).

12. A demodulator circuit as claimed in claim 10, comprising a bandpass filter (60), a first and a second mixer circuit (64, 70) and an adder circuit (66), wherein the bandpass filter (60) receives the input signal and generates a bandpass-filtered input signal, and the adder circuit (66) generates a notch filter output signal (ONOTCH) as a difference between the bandpass filtered input signal and the input signal, the first mixer circuit (64) combines the bandpass-filtered input signal and a 90° phase-shifted input signal so as to generate a demodulated useful signal (OMPX), and the second mixer circuit (70) combines the notch filter output signal (ONOTCH) and a 90° phase-shifted input signal so as to generate a demodulated interference signal (OMPXA).

13. A demodulator circuit as claimed in claim 12, characterized in that the bandpass filter (72) receives the input signal and the 90° phase-shifted input signal, and precedes two parallel anti-demodulator branches each comprising an adder circuit (90, 92) so as to generate a first and a second, 90° phase-shifted notch filter output signal (ONOTCH COS, ONOTCH SIN), as well as two parallel demodulator branches each comprising a mixer circuit (74, 78) so as to generate a first and a second, 90° phase-shifted demodulated useful signal.

14. A demodulator circuit as claimed in claim 13, characterized in that the two demodulator branches are connected in one adder circuit (80) so as to generate a difference between the demodulated useful signal and the phase-shifted demodulated useful signal, the adder circuit (80) preceding an amplifier circuit (84).

15. A demodulator circuit as claimed in claim 13, characterized in that the outputs of the two anti-demodulator branches are connected to an adder circuit (102) so as to form a difference between the demodulated interference signal and the phase-shifted demodulated interference signal.

* * * * *